(12) United States Patent
Mautz et al.

(10) Patent No.: US 6,759,248 B2
(45) Date of Patent: Jul. 6, 2004

(54) SEMICONDUCTOR WAFER IDENTIFICATION

(75) Inventors: Karl Mautz, Round Rock, TX (US); Jason Zeakes, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/966,046

(22) Filed: Sep. 28, 2001

(65) Prior Publication Data

US 2003/0064531 A1 Apr. 3, 2003

(51) Int. Cl.⁷ .......................... H01L 21/00; H01L 21/76
(52) U.S. Cl. .......................... 438/3; 438/401; 257/620; 257/797
(58) Field of Search .......................... 438/3, 401, 620, 438/797; 257/620, 797; 148/33.2

(56) References Cited

U.S. PATENT DOCUMENTS 6,307,241 B1 * 10/2001 Awschalom et al. ........ 257/421

* cited by examiner

Primary Examiner—Erik J. Kielin
Assistant Examiner—David S. Blum

(57) ABSTRACT

A semiconductor wafer (10), a method of providing information on a semiconductor wafer (10), a system of semiconductor wafer (10) and reading means, and a method of reading information from a semiconductor wafer (10) are provided. The invention is characterized by magnetic means (14) as information carrier and the respective magnetic sensors (26) to read such information.

4 Claims, 1 Drawing Sheet

SEMICONDUCTOR WAFER IDENTIFICATION

FIELD OF THE INVENTION

The present invention generally relates to a semiconductor wafer, and more particularly to a semiconductor wafer having a region carrying information for identification. The present invention further relates to a method of providing on a semiconductor wafer a region carrying information for identification. Moreover, the present invention relates to a system and a method for identifying a semiconductor wafer having a region carrying information for identification.

BACKGROUND OF THE INVENTION

The identification of semiconductor wafers is an important task before, during and after semiconductor wafer processing. For example, an identification of a wafer may be used to teach a process tool of the particular features of the special wafer so that process parameters can be adjusted accordingly.

In order to identify silicon wafers or other substrates in manufacturing or research facilities, the wafers are identified with a special marking. Such marking usually comprises a code, for example alphanumeric, T7, OCR and/or bar code. In this way, an individual wafer may be uniquely identified within a lot or a batch. Also, some raw silicon wafers have supplier marking, which is mostly alphanumeric, that identifies the pull, crystal or batch.

These special markings are usually provided by laser scribing. In order to retrieve the information, the marking is read by optical means.

Unfortunately, the optical information tends to disappear or to become unreadable during the processing of the wafer. In particular, extremely small and shallow markings tend to disappear after various film deposition steps over them. Also a laser scribe done prior to device processing tends to be come unreadable to naked eye, microscope or optical character readers due to this effect.

There are even more problems related to laser scribing. Such technique produces slag and particle defects on the wafer surface as a result of the scribing (pitting) process. Further, nucleation sites for silicon defects are created. The laser scribing allows contamination to collect in and around the scribe during processing. Further, the marking is typically located on the extreme wafer edge where film deposition is less stable and less uniform. The space that is needed for the laser scribing may reduce the usable space on the wafer surface. Markings on the backside of the wafer negatively impact the backside flatness.

Thus, laser scribing is problematic for wafer suppliers and manufactures of integrated circuits due to the techniques used, reading difficulties and the creation of defects and contamination.

The present invention seeks to solve the above mentioned problems by providing new devices, systems and methods by which a wafer may be uniquely identified.

DETAILED DESCRIPTION OF THE PREFERRED EMBODIMENTS

Figure 1:
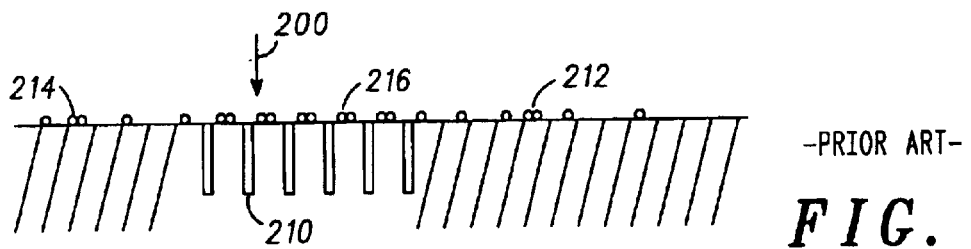
FIG. 1 is a schematic cross sectional view of a semiconductor wafer that is marked by a prior art technology.

According to the present invention, a semiconductor wafer 10 is provided having at least one region 12 carrying information 14 for identification, the information for identification being provided by magnetic means 14.

According to the present invention, there is further provided a method of providing on a semiconductor wafer 10 at least one region 12 carrying information 14 for identification, comprising the steps of providing a semiconductor wafer 10, and providing the at least one region 12 with magnetic means 14.

According to the present invention there is still further provided a system for identifying a semiconductor wafer 10 comprising a semiconductor wafer 10 having at least one region 12 carrying information 14 for identification and reading means 26 for reading the information 14 for identification, wherein the information for identification is provided by magnetic means 14, and the reading means comprises a magnetic sensor 26 placed adjacent to a surface 28, 30 of the semiconductor wafer 10.

Moreover, according to the present invention there is provided a method for identifying a semiconductor wafer 10 having at least one region 12 carrying information 14 for identification, using reading means 26 for reading the information 14 for identification, comprising the steps of:

providing the information for identification by magnetic means 14, and reading the information 14 for identification by a magnetic sensor 26 placed adjacent to a surface 28, 30 of the semiconductor wafer 10.

There are several advantages related to the present invention.

The contamination potential as experienced with physical surface modifying laser scribe is completely removed.

The information that is carried by the magnetic means is readable through multilayer thick overlying films.

The magnetic susceptibility of, for example, silicon is such that it will not interfere with the magnetic properties of the material.

The procedure of marking the silicon wafer could be performed by wafer suppliers or by manufactures of integrated circuits.

A metallic contamination from the process of depositing the magnetic means will by minimized due to overlying films such as EPI, backseal, and the implanted depth of the ions within the, for example, silicon. The implanted ions will remain in-place, due to their limited mobilities.

If the magnetic means are provided on the backside of the wafer, this area can be ultimately removed during backgrind.

The concept of the present invention is compatible with advanced device processing schemes such as Cu, low k, and SOI.

The present invention would create a magnetic identifier, such as a bar code or various other known versions in which alphanumeric information is coded within a given space. The magnetic identifier can by located on the wafer either in addition to or instead of the existing laser scribe mark. The magnetic identifier would reside in a similar position on the wafer as the laser scribe, preferably on the front side or back side, the extreme edge or in an edge exclusion region. Thus, the magnetic identifier does not interfere with production schemes or cause contamination. However, it is also within the scope of the present invention that the magnetic identifier is located in an inner region of the wafer where it is engaged by a vacuum chuck during wafer processing. In this case, the vacuum chuck is provided with reading capabilities.

The magnetic identifier would be produced by ion implantation, including plasma immersion ion implant, or sputtering techniques in which ions of magnetic elements are injected into and below the surface of the substrate (Si, SiGe, GaAs, SOI, glass, etc.). To code the identifier information on the wafer, a mask or other removal pattern may need to be placed on the wafer at this position to provide separation and readability. Thereby, also contamination is prevented. However, it is also possible to provide the information without masking, namely in the case of direct write using techniques such as in situ laser doping or an ion beam. An encapsulation film can be placed over the identifier area. Alternatively, other film deposition, as, for example, initial film deposition, may be used as a cover to prevent contamination.

FIG. 1 is a schematic cross sectional view of a semiconductor wafer 110 that is marked by a prior art technology. The wafer 110 is marked by a laser scribe beam 200 that forms laser scribe pits 210 into the wafer 110. The positions of the laser scribe pits 210 can be sensed by optical means. However, a disadvantage of the laser scribe process is also visible in FIG. 1, namely the resulting contamination 212, 214, 216. There is eject a slag 212, 214 in regions apart from the laser scribe pits 210, and there is crater slag 216 in the close vicinity of the laser scribe pits 210. These contaminations 212, 214, 216 lead to reading difficulties. Further reading difficulties are created by subsequent film deposition and etching operation.

Figure 2:
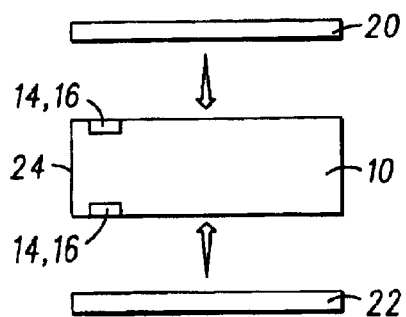
FIG. 2 is a cross sectional view of a first embodiment of a semiconductor wafer having magnetic properties according to the present invention.

FIG. 2 is a cross sectional view of a first embodiment of a semiconductor wafer having magnetic properties according to the present invention. On both surfaces of the wafer 10 an area is implanted with magnetic ions 16. These ions 16 act as magnetic means in order to provide a unique format, such as a bar code. The magnetic buried layer 14, 16 can then be protected by film layers 20, 22, for example an EPI encapsulation 20 and an oxide back seal 22.

Figure 3:
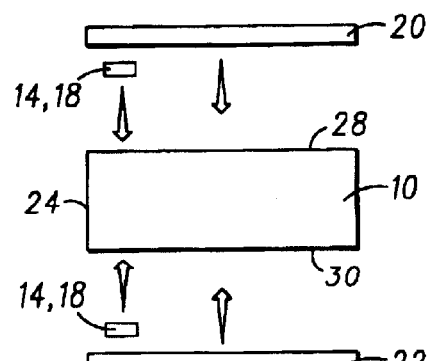
FIG. 3 is a cross sectional view of a second embodiment of a semiconductor wafer having magnetic properties according to the present invention.

FIG. 3 is a cross sectional view of a second embodiment of a semiconductor wafer having magnetic properties according to the present invention. In contrast to FIG. 2 an alternate technique without ion implantation is shown, namely the deposition of magnetic films 18 on the surfaces 28, 30 of the wafer 10. The magnetic films 18, can be bonded or deposited on the wafer at the manufacturer. It is important that the film would have to withstand the subsequent processing of the manufactures of integrated circuits. Also in this case, the magnetic means 18 can be protected by film layers 20, 22, similar to the embodiment according to FIG. 2.

Figure 4:
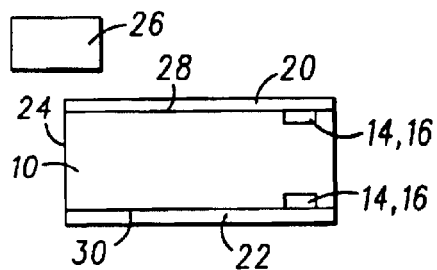
FIG. 4 is a cross sectional view of a system according to the present invention.
Figure 5:
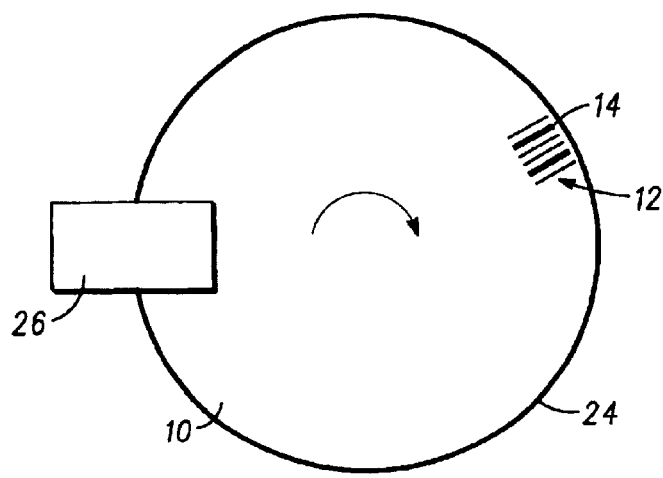
FIG. 5 is a top view of a system according to the present invention.

FIG. 4 is a cross sectional view of a system according to the present invention. FIG. 5 is a top view of a system according to the present invention. As an example, the semiconductor wafer 10 has an implanted bar code 14 in a region 12 near the edge 24 of the wafer 10. As shown in FIG. 4, there are codes 14, 16 provided on both surfaces 28, 30 of the wafer 10. However, it is also possible to use only one surface of the wafer 10 for magnetic identification. There is shown one magnetic sensor 26 that is placed above the edge 24 of the wafer 10. Due to a rotation of the wafer 10, the bar code 12 passes the magnetic sensor 26. It is advantageous, that multiple passes of the bar code 14 are used to insure a correct identification. Thus, it is possible to read the magnetic identification in a fashion that is similar to the reading of hard disk drives.

Alternatively, the magnetic sensor can be mounted so that is rotates above the wafer, thereby being able to read the identifier.

Generally it should be insured, that magnetically assisted etching processes are not used in a way that they impact the readability of the code.

In addition to codes that are realized by magnetic and nonmagnetic areas, such as a bar code, it is also possible to provide a field area without separations. The programming of such field area can then be done similarly as in magnetic tape technology.

While the invention has been described in terms of particular structures, devices and methods, those of skill in the art will understand based on the description herein that it is not limited merely to such examples and that the full scope of the invention is properly determined by the claims that follow.

What is claimed is:

1. A method of providing on a semiconductor wafer at least one region carrying information for identification of the semiconductor wafer, comprising:

providing a semiconductor wafer; and providing the at least one region with magnetic means, wherein the magnetic means are provided by ion implantation of magnetic ions.

2. The method according to claim 1, wherein the magnetic means are proximate a semiconductor wafer edge.

3. The method according to claim 1, wherein the magnetic means are proximate an inner region of a semiconductor wafer surface, where a vacuum chuck apparatus having magnetic reading capabilities may engage the semiconductor wafer.

4. The method according to claim 1, further comprising covering the magnetic means with at least one film layer.

* * * * *